(12) United States Patent
Mateman

(10) Patent No.: US 7,944,382 B2
(45) Date of Patent: May 17, 2011

(54) EXPONENTIAL DIGITAL TO ANALOG CONVERTER

(75) Inventor: Paul Mateman, Millingen Aan de Rijn (NL)

(73) Assignee: NXP B.V., Eindhoven (NL)

( * ) Notice: Subject to any disclaimer, the term of this patent is extended or adjusted under 35 U.S.C. 154(b) by 288 days.

(21) Appl. No.: 12/278,858

(22) PCT Filed: Feb. 6, 2007

(86) PCT No.: PCT/IB2007/050394
§ 371 (c)(1),
(2), (4) Date: Aug. 8, 2008

(87) PCT Pub. No.: WO2007/096796
PCT Pub. Date: Aug. 30, 2007

(65) Prior Publication Data
US 2010/0164771 A1    Jul. 1, 2010

(30) Foreign Application Priority Data
Feb. 21, 2006   (EP) .................................... 06110216

(51) Int. Cl.
*H03M 1/00*    (2006.01)
(52) U.S. Cl. ........................................ 341/139; 341/144
(58) Field of Classification Search .................. 341/139, 341/138, 144, 136, 145; 326/82, 122, 26, 326/27
See application file for complete search history.

(56) References Cited

U.S. PATENT DOCUMENTS

| | | | | |
|---|---|---|---|---|
| 5,592,410 A * | 1/1997 | Verhaeghe et al. | ............ | 365/145 |
| 6,163,708 A | 12/2000 | Groe | | |
| 6,392,574 B1 * | 5/2002 | Toosky | ......................... | 341/138 |
| 6,518,899 B2 | 2/2003 | Yu | | |
| 6,653,961 B1 * | 11/2003 | Gosser et al. | .................. | 341/144 |
| 6,909,389 B1 | 6/2005 | Hyde et al. | | |
| 7,116,253 B2 | 10/2006 | Norsworthy et al. | | |

FOREIGN PATENT DOCUMENTS

EP    1473837 A1    11/2004
WO    0039992 A    7/2000

OTHER PUBLICATIONS

Guilherme J et al; "New Logarithmic Two-Step Flash A/D Converter With Digital Error Correction for MOS Technology". Circuits and Systems, 1995, Proceedings., Proceedings of the 38th Midwest Symposium on Rio de Janeiro, Brazil. Aug. 13-16, 1995, New York, NY, USA, IEEE, US. vol. 2, pp. 881-884.

* cited by examiner

*Primary Examiner* — Rexford N Barnie
*Assistant Examiner* — Joseph Lauture

(57) ABSTRACT

A system for generating a programmable exponential analog output signal, comprising a digital to analog conversion circuit for converting said digital signal into an analog output signal, the digital to analog conversion circuit having a substantially exponential transfer function defined by a programmable ratio of values of components. Preferably, the conversion circuit is implemented as a current mirror (100), with the exponential transfer function being defined by the mirror ratio. Thus, each transistor of the current mirror (100) defines a step of the digital to analog conversion circuit, and the ratio between adjacent steps is substantially constant. The transistors may be substantially equally sized or binary weighted relative to each other, and can be switched from the input to the output under the control of a tree based thermometer line decoder.

10 Claims, 8 Drawing Sheets

EXPONENTIAL DIGITAL TO ANALOG CONVERTER

This invention relates generally to an exponential digital to analog converter (DAC).

Digital to analog conversion is a process in which signals having a few (typically two) defined levels or states are converted into signals having quantized analog states. A digital signal typically has two states: zero and one. However, when a binary digital signal has been decoded by a digital to analog converter (DAC), the resultant analog has a relatively large number of states and conveys data as electronic signals of varying frequency or amplitude that may be added to a carrier wave of a given frequency to produce an output in the form of, for example, voice, picture, musical tone or mechanical motion.

The transfer characteristics of a DAC are typically linear and often, bias signals for example, are programmable by means of a linear DAC. However, in the case of a linear DAC, the stepsize is fixed and dictated by the smallest required step. When using a linear DAC to generate a bias signal, this means that the impact of a step is much bigger at low DAC values than at higher DAC values. Many bias currents perform some sort of multiplying function and, in such cases, an exponential DAC may be preferable, because each step has the same 'relative impact', thus the impact of one step is essentially the same over the whole DAC range, i.e. small increments at low DAC values, large increments at high DAC values. In this case, the impact of each step is measured by percentage, e.g. each step represents a 10% increase. An additional advantage of using an exponential DAC is that fewer bits are needed to cover the required range.

U.S. Pat. No. 6,392,574 describes an exponential DAC based on a traditional linear DAC, where part ($\alpha$) of the output current is fed back to the input. However, the use of a positive feedback loop can cause inherent instability and the proposed design is very sensitive to variations (caused by, for example, mismatch) in the fraction ($\alpha$) of the output current being fed back to the input.

It is therefore an object of the present invention to provide a system and method for exponential digital to analog conversion, wherein the design implementation is more robust and inherently more stable relative to the prior art.

According to the present invention, there is provided a system for generating a programmable exponential analog output signal, the system comprising an input for receiving an input, a digital to analog conversion circuit for converting a digital codeword into an analog output signal, the digital to analog conversion circuit being implemented by a plurality of components and having a substantially exponential transfer function defined by a ratio of values of said components, and an output for outputting said analog output signal.

Thus the analog output current is programmable based on a variable digital input value, and an exponential transfer function is approximated based on a ratio of component values.

Beneficially, the digital to analog conversion circuit comprises a plurality of transistors in a current mirror configuration, and the exponential transfer function is defined by the mirror ratio of said current mirror. Beneficially the transfer function is in the form $$\frac{Iout}{Iin} \alpha \frac{N+x}{N-x},$$

where N is a fixed value, x is defined by the digital input value and Iout and Iin are the output and input currents respectively of said circuit. In the case where the digital to analog conversion circuit is realized by a current mirror, N is proportional to the number of transistor devices. Each value of said transfer function is a set of values defined by a range of digital input values defining a step of the digital to analog conversion circuit, and the ratio between adjacent steps is preferably substantially constant across said range. In one exemplary embodiment of the invention, a plurality of transistors defining the number of bits of said digital to analog conversion circuit are provided between said mirror transistors and are switched from input to output to realize the desired analog output signal. The transistors may be substantially equally sized. In this case, the transistors may comprise unit transistors or scaled versions thereof. In an alternative exemplary embodiment, the transistors may be binary weighted relative to each other.

Preferably, the plurality of transistors can be switched from the input to the output under the control of a line decoder. The line decoder may comprise at least one AND gate and at least one OR gate, and may be arranged and configured to have a delay between switching transistors, the delay being substantially equal to a gate delay.

These and other aspects of the invention will be apparent from, and elucidated with reference to, the embodiments described herein.

Embodiments of the present invention will now be described by way of examples only and with reference to the accompanying drawings in which:

FIG. 1a is a graphical representation of the transfer curves of $$\frac{N+x}{N-x}$$

with unit transistors in a system according to an exemplary embodiment of the invention; wherein curve A represents the case for N=10 and curve B represents to case for N=18 where X (defined by the DAC input value) ranges from −8 to =8;

Thus, the present invention relates to a mechanism for generating an exponential programmable current (i.e. programmable in dB steps), having the feature whereby the ratio between two adjacent steps is nearly constant. In this case, each step represents the same percentage increase. In the following, two exemplary embodiments of the invention will be described: first, a current mirror that has a programmable mirror ratio, and second, a tree based thermometer decoder suitable for controlling the first exemplary embodiment mentioned above.

The following exemplary embodiments of the invention are based on the observation that the function $$\frac{N+x}{N-x}$$

has a fairly exponential behavior for $|x|<N-M$ (where M is used to control the slope of the transfer curve and X is dependent on the DAC input value). Since the sum of numerator and denominator is constant (i.e. when the programmable DAC input value is zero, so that the transfer function is 1 and Iout=Iin), this behavior can readily be implemented using a current mirror where a number of transistors can be switched from input to output, controlled by switches.

The following definitions will be used hereinafter:
N=number of DAC bits
D=DAC input value (binary number)
$N=M+2^{n-1}$ where M>0; M controls the maximum range that can be realized (gain)
$x(D)=D-2^{n-1}$ In other words, a DAC wherein the output current $$Iout = \left(\frac{N+x}{N-x}\right)Iin$$

would have an approximately exponential transfer function over the above-mentioned range, where $$\left(\frac{N+x}{N-x}\right)$$

defines the step size. Since x is dependant on the (controllable) DAC input value (and the sum of the numerator and denominator is constant), when the DAC input value is zero, Iout=In so the transfer function can be implemented by means of a current mirror configuration.

N represents the number of devices on one side of the equilibrium point (thus, 2*N is the total number of devices). The value x can be negative (taking away devices from the output, and switching them to the input) or positive (adding devices to the output that are taken from the input). M0 and M1 represent the number of fixed devices on both sides. This effectively reduces the ration that can be realized, thus controls the slope (or gain). M0 and M1 need not necessarily be equal. M is defined herein as (M0+M1)/2 and is introduced solely to simplify the formulae.

Figure 1A:
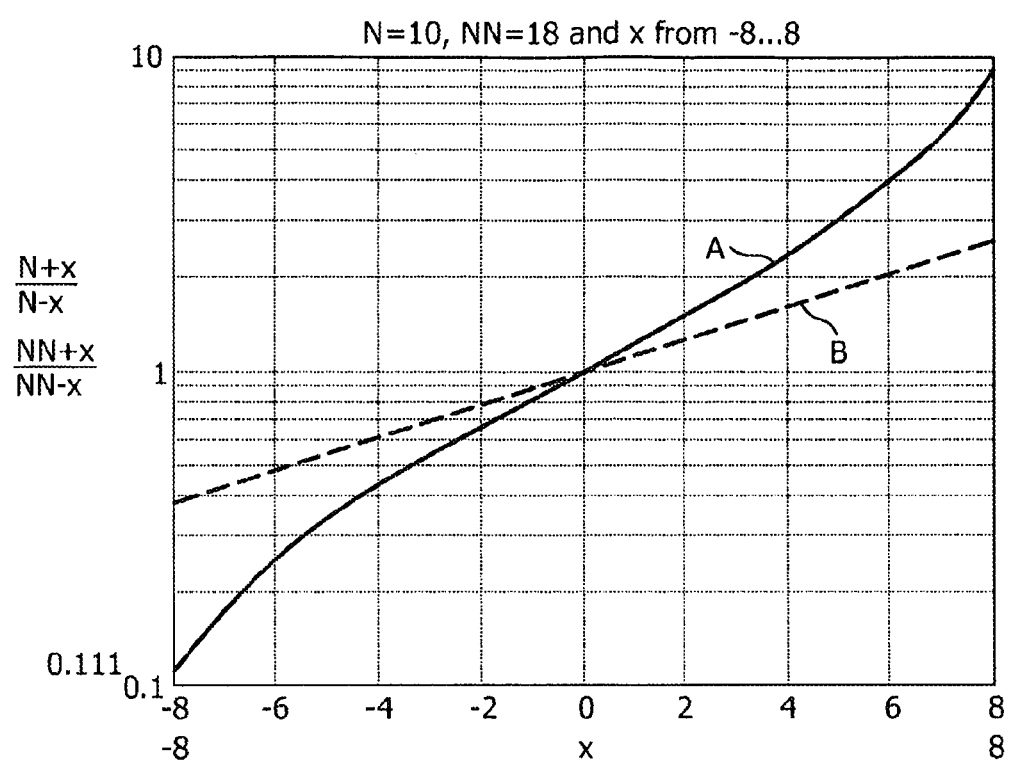
FIG. 1b is a graphical representation (curves A' and B' respectively) of the deviation of the curves (A and B) of FIG. 1a from the true exponential (%)
Figure 1B:
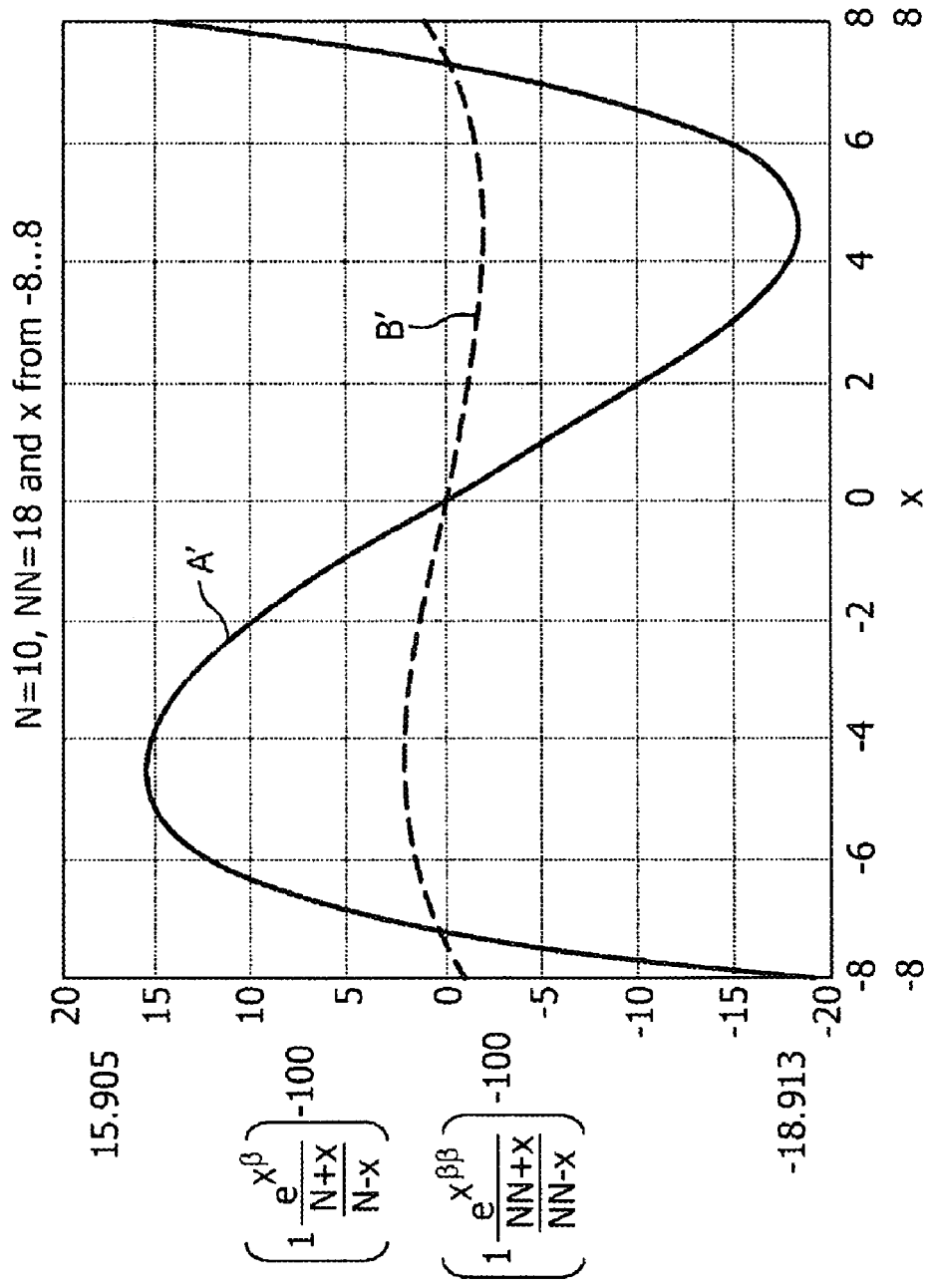

FIG. 1a shows a transfer curve A and B used herein for M=2 and M=10, respectively. The extremely low value for M (=2) was chosen to show the curvature. The value for M controls the range over which the output current can be programmed: higher M will result in a lower range (=lower gain), but will also be much more precise. It will be appreciated that the steps in the graphs depicted herein have been interpreted to show smooth graphs, but that the steps are actually discrete. Thus, as shown in FIG. 1b, when M=2 (curve A'), the gain may be greater but the deviation of the transfer curve from the true exponential is significant, whereas when M=10, the gain is lower but the deviation transfer curve (B')from the true exponential is much less significant.

In more detail, consider the case where M=2 and x (=D−$2^{n-1}$) is −8 to +8 (thus, N=10) and n=4. For this case, we have $$\left(\frac{N+x}{N-x}\right) = 2/18, 3/17, 4/16, 5/15, 6/14, 7/13, 8/12, 9/11,$$

$$10/10, 11/9, 12/8, 13/7, 14/6, 15/5, 16/4, 17/3, 18/2,$$

giving ratios between adjacent steps of: 0.61, 0.72, 0.76, 0.77, 0.80, 0.81, 0.82, 0.82, 0.82, 0.81, 0.81, 0.80, 0.78, 0.71, 0.63

Thus, the ratio between two adjacent values is within 15% "constant".

Sometimes, more accuracy is required. It might be sufficient to choose a bigger M, but the transfer can also be linearized by replacing unit sized transistors with scaled versions to make a real exponential.

Consider the case where M=10, on the other hand, N=18 and the resultant step sizes are: 10/26, 11/25, 12/24, 13/23, 14/22, 15/21, 16/20, 17/19, 18/18, 19/17, 20/16, 21/15, 22/14, 23/13, 24/12, 25/11, 26/10, giving ratios between adjacent step sizes of: 0.86, 0.88, 0.88, 0.89, 0.90, 0.89, 0.90, 0.89, 0.89, 0.90, 0.89, 0.89, 0.89, 0.89, 0.88, 0.87 i.e. much closer to the desired constant ration between adjacent step sizes across the whole range, however, the range itself has been reduced.

Figure 4:
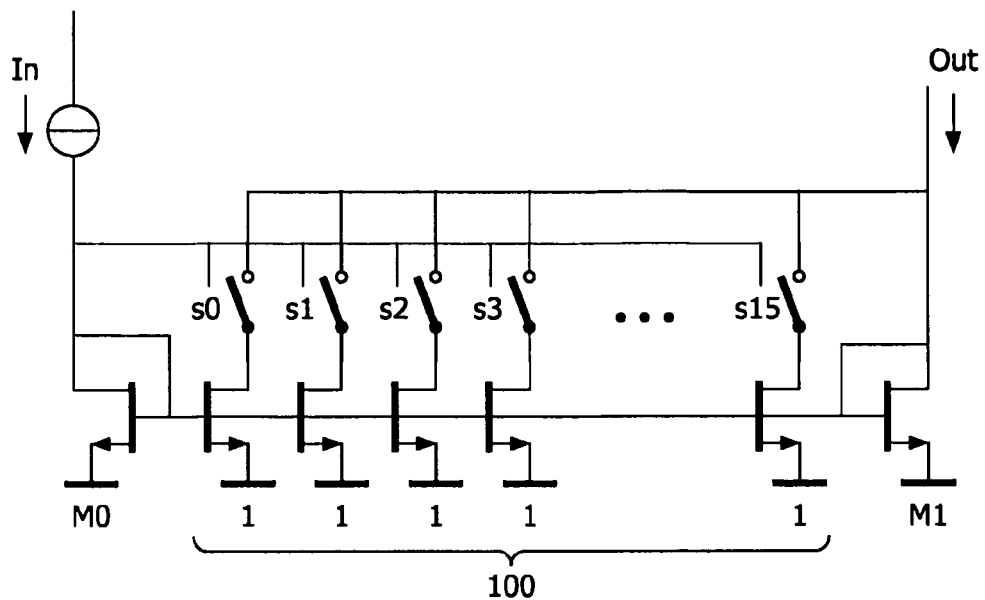
FIG. 4 is a schematic circuit diagram of a thermometer code based DAC according to a first exemplary embodiment of the invention.
Figure 5:
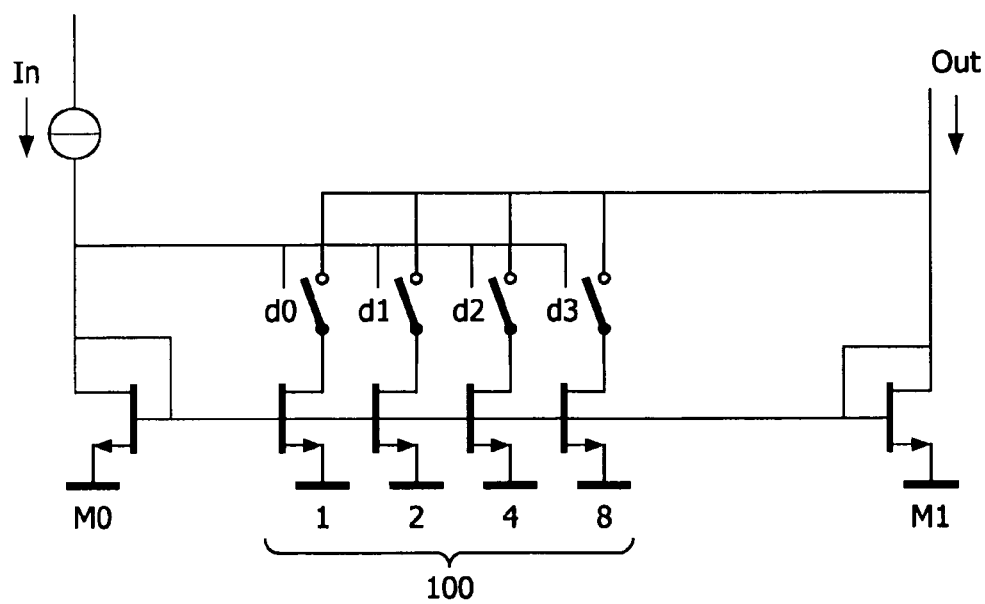
FIG. 5 is a schematic circuit diagram of a binary code based DAC according to a second exemplary embodiment of the invention.
Figure 6:
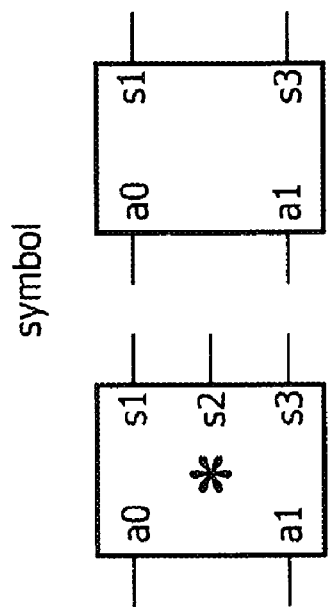
FIG. 6 is a schematic diagram and symbol illustrating a unit decoder cell for use in implementing a system according to an exemplary embodiment of the invention (the symbol with the asterisk has an extra output)
Figure 6:
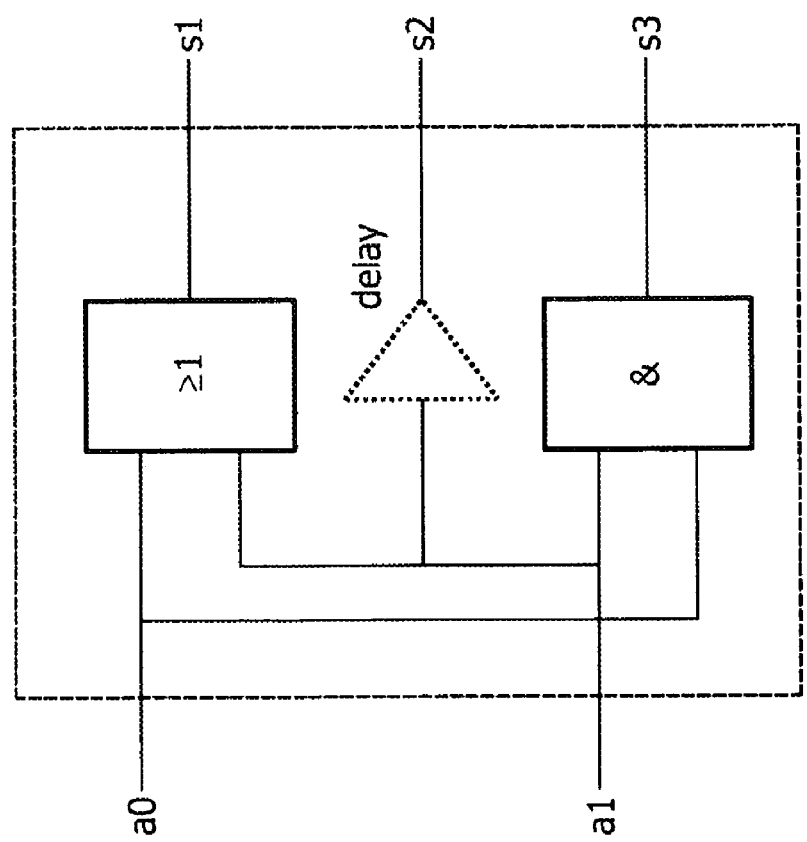

The curve (B) of FIG. 1a can be realized using a current mirror 100 as shown in FIGS. 4 and 5. The transistors in the mirror can be equally sized (FIG. 4: thermometer code) or binary weighted (FIG. 5). The transistors with width M0 and M1 control the symmetry of the control range (M=(M0+M1)/2). Choosing different values for M0 and M1 in effect only changes the "offset" in the x(D) function. The thermometer code based version (FIG. 4) will have smaller glitches and will not be significantly bigger than the binary weighted version when using an efficient thermometer decoder (see description below in relation to FIGS. 6-9).

Figure 2:
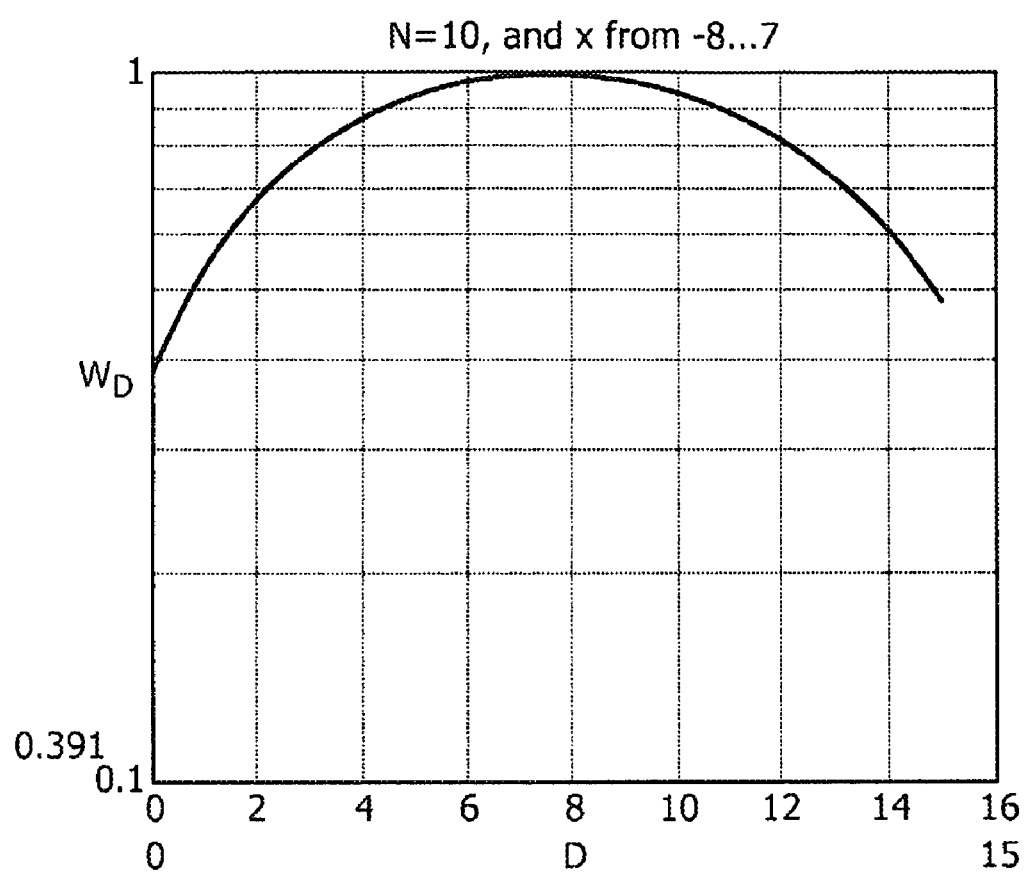
FIG. 2 illustrates graphically scaled weights for application to the transistor of a system according to an exemplary embodiment of the invention.

When more accuracy is needed but choosing a bigger M is not an option because of the above-mentioned range reduction, the unit transistors of the thermometer version (connected to s0 ... s15 in FIG. 4) can be replaced with scaled versions (see FIG. 2)

$$W_D = \frac{N^2 - x(D)^2}{N^2 + x(D)}$$

Figure 3:
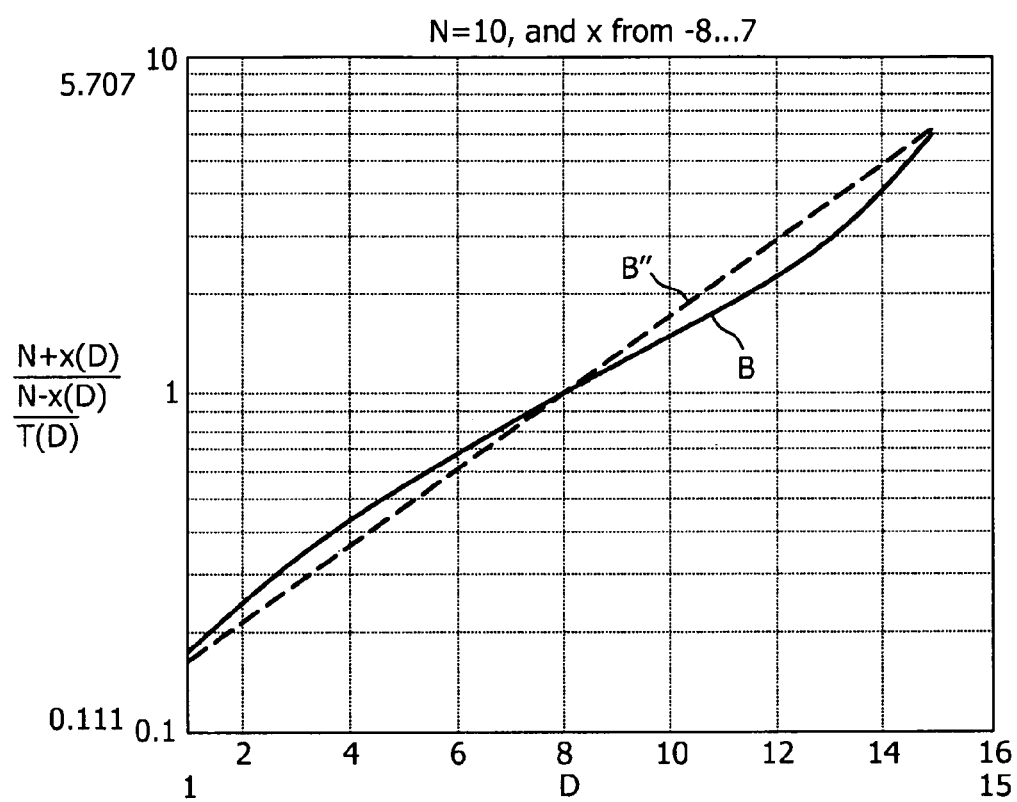
FIG. 3 illustrates graphically (curve B") the effect on curve B (of FIG. 1a) using scaled weights in respect of the current mirror transistors of a system according to an exemplary embodiment of the invention.

(slightly smaller than 1) to make a true exponential transfer function (as shown in FIG. 3).

Since the above-described embodiment of the invention is based on a current mirror it is obvious that the impact of mismatch in individual transistors is very limited (no multiplication occurs), moreover at small DAC values the impact is also small, and for higher DAC values the impact is bigger, but the ratio between output current and mismatch current is almost constant.

The above-mentioned exemplary embodiments of the present invention are current mirror based, but it will be apparent that it could be extended to any circuit that realizes an exponential transfer function that is based on a ratio of component values (e.g. an inverting OpAmp configuration with a gain determined by resistor ratios). In case of an (inverting) amplifier with programmable gain, the gain=R1/R2, where R1 is the feedback resistor from output to the inverting input of the operational amplifier, and R2 is the input resistor (from circuit input to inverting input of the operational amplifier). Imagine a circuit where R1 and R2 are replaced with a string of series connected (unit) resistors and a switch array that can connect from (only) one of the taps to the inverting input of the operational amplifier. When there are 2N resistors the gain now can be rewritten as:

$$Gain = R2/R1 = (N+Rx)/(N-Rx)$$

where x in the range −N+M to 2N−M

So this circuit is a (linear) amplifier with a gain that can be programmed in exponential steps (=linear in dB).

Figure 7:
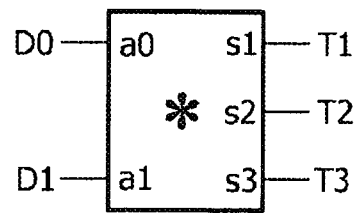
FIGS. 7, 8 and 9 illustrate schematically a 2-line, 3-line and 4-line decoder respectively for use in a system according to an exemplary embodiment of the present invention.
Figure 8:
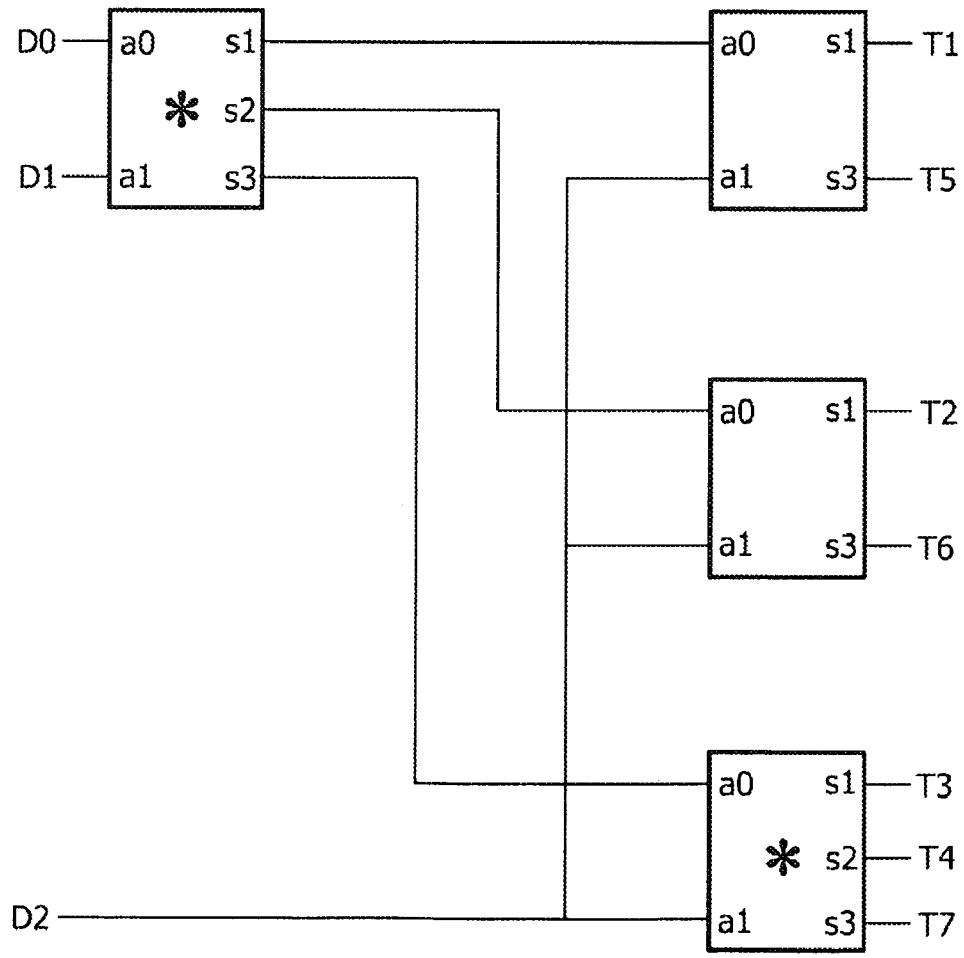
Figure 9:
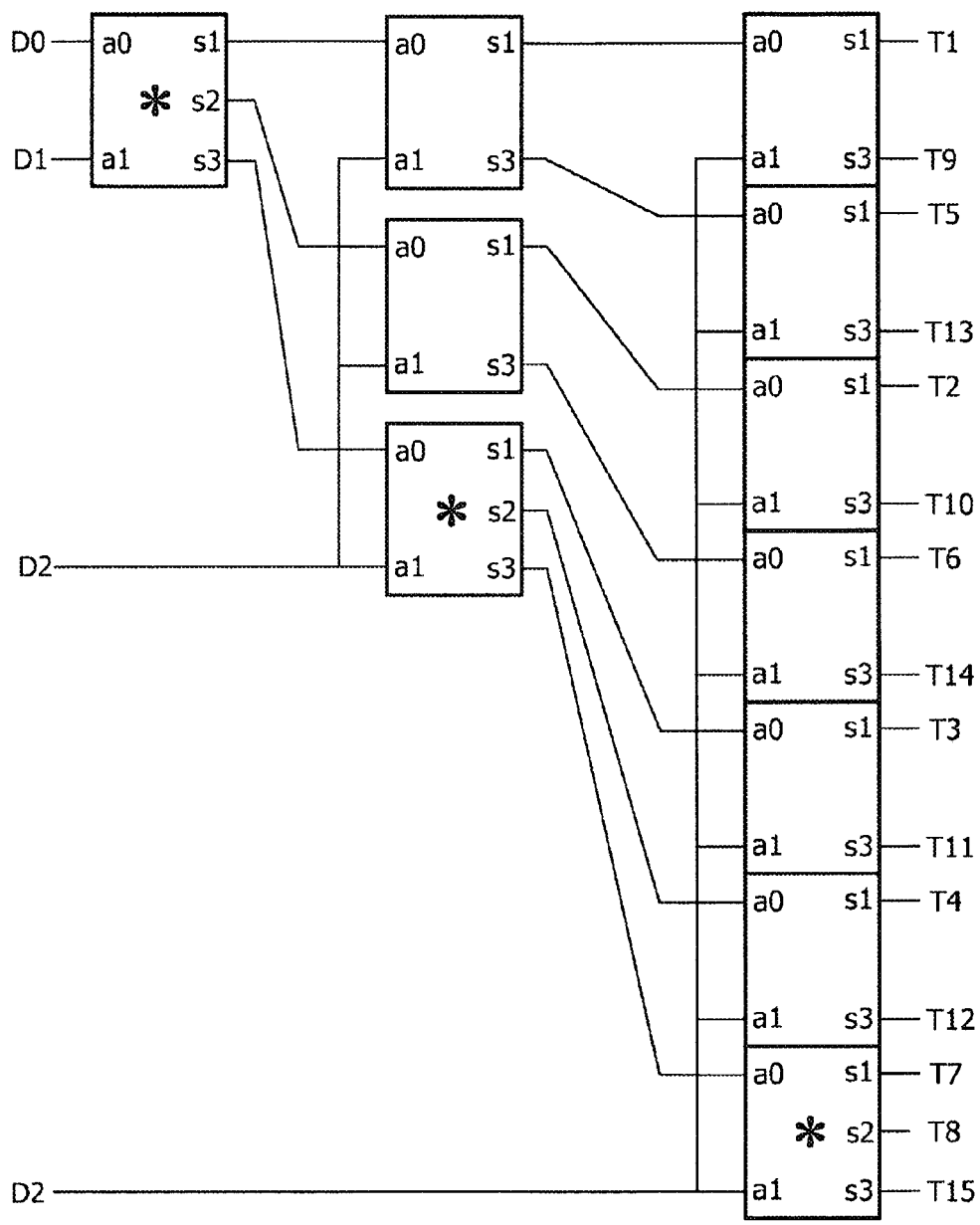

A thermometer decoder translates a binary input (D) into thermometer coded word (first D bits high, rest low). An efficient means for realizing the thermometer decoder is shown in FIGS. 6 to 9. The unit building block is a 2-line decoder (FIG. 6) with an AND gate and an OR gate. The delay is chosen to be equal to a gate delay, in order to minimize the glitch energy when switching code words. FIGS. 7, 8 and 9 show implementations of a decoder for 2, 3, and 4 inputs.

The implementation of the present invention has many advantages, including:
1. inherent stability;
2. a much more robust design relative to the prior art;
3. less area, because it is insensitive to component mismatch;
4. very straight forward implementation;
5. can be linearized to follow an exact exponential curve (as shown in FIG. 3).

The invention is particularly suited for application in (deep) submicron CMOS processes; in application areas including:
Programmable bias circuits;
Logarithmic/exponential digital to analog conversion;
Logarithmic/exponential analog to digital conversion; and
Power control circuits

The invention claimed is:

1. A system for generating a programmable exponential analog output signal, the system comprising an input for receiving an input, a digital to analog conversion circuit for converting a digital codeword into an analog output signal, the digital to analog conversion circuit being implemented by a plurality of components having component values that define a gain and having a substantially exponential transfer function defined by a ratio of said component values, and an output for outputting said analog output signal wherein said transfer function is in the form $$\frac{Iout}{Iin} \alpha \frac{N+x}{N-x},$$

where N is proportional to said component values, x is defined by the digital input value and Iout and Iin are the output and input currents respectively of said circuit.

2. The system according to claim 1, wherein said digital to analog conversion circuit comprises a plurality of transistors in a current mirror configuration, and said exponential transfer function is defined by the mirror ratio of said current mirror.

3. The system according to claim 1, wherein said digital to analog conversion circuit is realized by a current mirror.

4. The system according to claim 1, wherein each value of said transfer function is a set of values defined by a range of digital input values defining a step of the digital to analog conversion circuit.

5. The system according to claim 4, wherein a plurality of transistors defining the number of bits of said digital to analog conversion circuit are provided between said mirror transistors and are switched from input to output to realize the desired analog output signal.

6. The system according to claim 5, wherein transistors are unit transistors.

7. The system according to claim 6, wherein the transistors are scaled.

8. The system according to claim 7, wherein said transistors are binary weighted relative to each other.

9. The system according to claim 6, wherein said plurality of transistors can be switched from said input to the output under the control of a line decoder.

10. The system according to claim 9, wherein said line decoder comprises at least one AND gate and at least one OR gate, and is arranged and configured to have a delay between switching transistors, the delay being substantially equal to a gate delay.

* * * * *